United States Patent
Herman et al.

(10) Patent No.: US 7,153,360 B2
(45) Date of Patent: Dec. 26, 2006

(54) TEMPLATE AND METHODS FOR FORMING PHOTONIC CRYSTALS

(75) Inventors: Gregory S Herman, Albany, OR (US); David Champion, Lebanon, OR (US); James E. Ellenson, Corvallis, OR (US)

(73) Assignee: Hewlett-Packard Development Company, LP., Houston, TX (US)

( * ) Notice: Subject to any disclaimer, the term of this patent is extended or adjusted under 35 U.S.C. 154(b) by 361 days.

(21) Appl. No.: 10/737,460

(22) Filed: Dec. 16, 2003

(65) Prior Publication Data
US 2005/0126470 A1 Jun. 16, 2005

(51) Int. Cl.
*C30B 9/02* (2006.01)

(52) U.S. Cl. ............... 117/68; 117/69; 117/72

(58) Field of Classification Search ............ 117/68, 117/79, 72
See application file for complete search history.

(56) References Cited

U.S. PATENT DOCUMENTS

| | | | |
|---|---|---|---|
| 5,172,267 A | | 12/1992 | Yablonovitch |
| 5,335,240 A | | 8/1994 | Ho et al. |
| 5,406,573 A | | 4/1995 | Ozbay et al. |
| 5,440,421 A | | 8/1995 | Fan et al. |
| 5,600,483 A | | 2/1997 | Fan et al. |
| 5,651,818 A | | 7/1997 | Milstein et al. |
| 5,772,905 A | * | 6/1998 | Chou ................. 216/44 |
| 5,997,795 A | | 12/1999 | Danforth et al. |
| 5,998,298 A | | 12/1999 | Fleming et al. |
| 6,139,626 A | | 10/2000 | Norris et al. |
| 6,309,580 B1 | | 10/2001 | Chou |
| 6,358,653 B1 | | 3/2002 | Turberfield et al. |
| 6,358,854 B1 | | 3/2002 | Fleming et al. |
| 6,392,787 B1 | | 5/2002 | Cirelli et al. |
| 6,468,823 B1 | | 10/2002 | Scherer et al. |
| 6,482,742 B1 | | 11/2002 | Chou |
| 6,517,995 B1 | | 2/2003 | Jacobsen et al. |
| 6,518,189 B1 | | 2/2003 | Chou |
| 6,680,214 B1 | | 1/2004 | Tavkhelidze et al. |
| 2002/0045136 A1 | | 4/2002 | Fritze et al. |
| 2002/0115002 A1 | | 8/2002 | Bailey et al. |
| 2002/0154403 A1 | | 10/2002 | Trotter, Jr. |
| 2002/0167118 A1 | | 11/2002 | Billet et al. |
| 2004/0053009 A1 | * | 3/2004 | Ozin et al. ............ 428/168 |
| 2004/0062700 A1 | * | 4/2004 | Miguez et al. ......... 423/266 |
| 2004/0067163 A1 | * | 4/2004 | Prasad et al. .......... 422/58 |
| 2005/0011873 A1 | * | 1/2005 | Withford et al. ....... 219/121.69 |
| 2005/0095417 A1 | * | 5/2005 | Jiang ................... 428/304.4 |

FOREIGN PATENT DOCUMENTS

| | | |
|---|---|---|
| EP | 1072954 A2 | 1/2001 |
| EP | 1072954 A3 | 1/2001 |
| EP | 1081513 A1 | 3/2001 |

(Continued)

OTHER PUBLICATIONS

Blaaderen, A. Van et al. Template-directed colloidal crystallization. Nature, MacMillan Journals Ltd. London, GB. vol. 385, 1997, pp. 321-324, XP000887195 ISSN: 0028-0836.

(Continued)

*Primary Examiner*—Robert Kunemund

(57) ABSTRACT

A self-assembled photonic crystal is formed using a template made by nanoimprint lithography. A layer of imprintable material is deposited on a substrate, a pattern is imprinted in the imprintable material to form a template (the pattern of the template being adapted to substantially constrain colloidal particles to a predetermined lattice), and colloidal particles are introduced onto the template, substantially filling the predetermined lattice.

69 Claims, 5 Drawing Sheets

FOREIGN PATENT DOCUMENTS

| | | |
|---|---|---|
| JP | 2000-258650 A | 9/2000 |
| JP | 2000-284136 A | 10/2000 |
| JP | 2000-314817 A | 11/2000 |
| JP | 2002-323631 A | 11/2002 |
| JP | 2002-323632 A | 11/2002 |
| WO | WO 02/33461 A2 | 4/2002 |
| WO | WO 02/33461 A3 | 4/2002 |
| WO | WO 03/084863 A1 | 10/2003 |

OTHER PUBLICATIONS

Gates, B. et al. Self-assembly of meso- and nanoparticles into 3D ordered arrays and its applications. Materials Rsch Soc. Symposium. Apr. 1999. vol. 576.

Brittain, S. et al. Soft lithography and microfabrication. Physics World. Bristol, GB. vol. 11, No. 5. May 1998. pp. 31-36. XP008022000.

PCT International Search Report. PCT/US2004/041052. Patent application filed Dec. 9, 2004. Report issued Aug. 30, 2005.

Anon. "UV based Nanopoint Lithography" http://www.amo.de/amica/nanoimprint.html (date unknown).

Sreenivasan "Nanoprint Lithography . . ."http://www.nnf.cornell.edu/JapanUS/SreenivasanJUSSymposium.p.

Lammers, "Nanoimprint lithography read . . . "Dec. 2, 2002 http://www.eetimes.com/at/news/OEG20021220S0022.

Hewitt, "Moulds Cut Photonic Crystal Costs" May 16, 2002 http://nanotechweb.org/articles/news/1/5/8/1.

Fleming et al."All-metallic three-dimensional photonic . . . " Nature V. 417 (May 2, 2002), p. 52-55.

Service, "Building Better Photonic Crystals" SCIENCE V. 295 (Mar. 29, 2002) p. 2399.

Anon. "Si-based photonic . . . " http://fisicavolta.unipv.it/dipartimento/ricerca/fotonici/ Cofin . . . pdf.

Vlasov et al. "On-chip natural assembly of silicon photonic . . . " Nature, V. 414 (Nov. 15, 2001), p. 289 ff.

Lin et al. "Silicon Three-dimensional Photonic . . . " Sandia National Lab report SAND2001-3612 (Nov. 2001).

Gasser et al. "Real-Space Imaging . . . " Science V. 292 (Apr. 13, 2001) pp. 258-262.

Norris et al. "Chemical Approaches to Three-Dim . . . " Adv. Mater., V. 13 (6) (Mar. 16, 2001), pp. 371-376.

Parker et al. "Photonic Crystals" Aug. 2000 http://physicsweb.org/article/world/13/8/9/1.

Wang et al. "Direct nanoimprint of submicron . . . " Appl. Phys. Let. V. 75 (18) (Nov. 1, 1999) pp. 2767-2769.

Vlasov et al. "Synthesis of Photonic Crystals for . . . " Adv. Mater. V. 11, No. 2 (1999) pp. 165-169.

Astratov et al."Photonic band gaps in 3D ordered . . . " Phys. Let. A 222 (Nov. 11, 1996) pp. 349-353.

Chou et al. "Imprint Lithography with 25-Nanometer . . . " Science V. 272 (5258) (Apr. 5, 1996) pp. 85-87.

Chou et al. "Imprint of sub-25 nm vias . . . " Appl. Phys. Let. V. 67(21) (Nov. 20,1995) pp. 3114-3116.

McGurn et al."Photonic band structures of two- . . . " Phys. Rev. B. V. 48(23) Dec. 15, 1993, pp. 17576-17579.

Yablonovitch et al. "Photonic Band Structure: . . . "Phys. Rev. Let. V. 67(17) Oct. 21, 1991 pp. 2295-2298.

Ho et al. "Existence of a Photonic Gap . . . . " Phys. Rev. Letters V. 65(25) Dec. 17, 1990, pp. 3152-3155.

\* cited by examiner

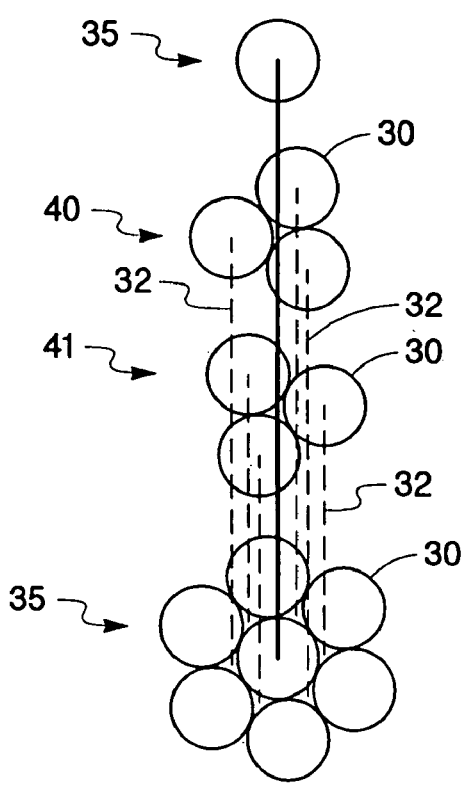 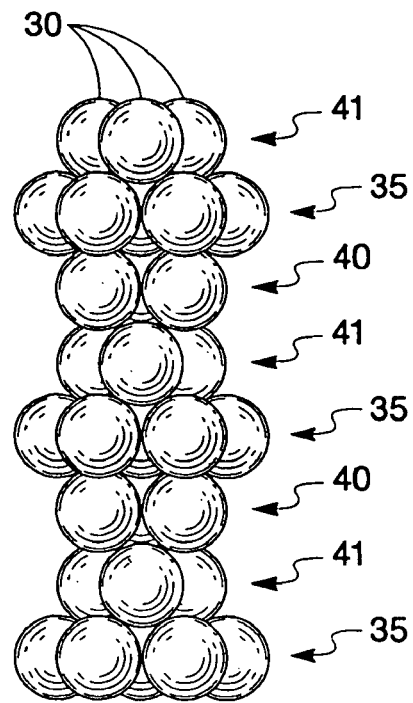
Fig. 4a　　　　Fig. 4b
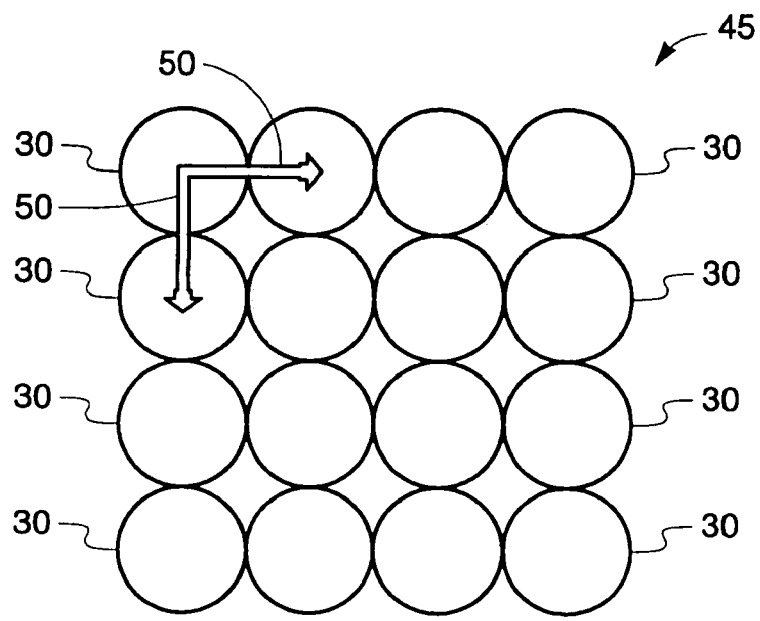
Fig. 5

TEMPLATE AND METHODS FOR FORMING PHOTONIC CRYSTALS

TECHNICAL FIELD

This invention relates to photonic crystals and more particularly to methods for forming photonic crystals using a template made by nanoimprint lithography.

BACKGROUND

Photonic crystals are spatially periodic structures having useful electromagnetic wave properties, such as photonic bandgaps. In principle, the spatial periodicity of a photonic crystal can be in one, two, or three dimensions. There is especially high interest in developing technology of artificial photonic crystals that are useful in new and improved functional photonic devices, especially for the infrared and visible-light portions of the electromagnetic spectrum. Functional devices using photonic crystals, such as selective reflectors, filters, optical couplers, resonant cavities, delay lines, and waveguides have been proposed and/or fabricated.

Several methods for forming artificial photonic crystals are known. Multilayered dielectric films have been used to make one-dimensional photonic crystals along the dimension perpendicular to the films.

Three-dimensional photonic crystals have been formed by stacking and bonding wafers in which periodic structures have been micromachined by etching. Such methods result in structures called "wood-pile" or "picket-fence" structures because the stacked elements have an appearance similar to stacked square timbers. Such methods require precise alignment of the micromachined wafers to be bonded together, which becomes more difficult as the number of layers increases and the dimensions of micromachined features are reduced.

Some of the known methods for forming artificial photonic crystals work by modifying refractive index periodically in a material originally having a uniform refractive index. For example, light-wave interference or holography has been used to create periodic variations of refractive index within photosensitive materials, such as photoresist, to make photonic crystals. Perhaps the simplest methods for forming a one- or two-dimensional photonic crystal are those methods that form a periodic or quasi-periodic array of holes in a uniform slab of material. A vacuum or material filling the holes has a different index of refraction from the base material of the slab. In the background art, such holes have been formed by micro-machining or by nanoscale lithography, such as electron-beam or ion-beam lithography. Conversely, such charged-particle beam lithography has also been used to selectively assist deposition of material to form spaced elements of the photonic crystal. Some photonic crystals have been formed by self-assembly of very small particles provided in a colloidal suspension. Nanocrystals, for example, have been assembled from a colloidal suspension, concentrated as close-packed clusters in pores in a template (the pores being larger than the nanocrystals) to form a quantum-dot solid. In some cases, the interstitial spaces between the colloidal particles have been filled with a second material of a different refractive index. In some of those cases, the colloidal particles themselves have been removed to leave an "inverse" photonic crystal in which the crystal lattice positions are occupied by voids in a matrix of the second material.

While all of these methods and others have been used successfully to make small quantities of photonic crystals, more efficient methods for mass-production fabrication of photonic crystals are needed which also reduce or eliminate unintentional mixtures of different crystal lattices, misalignment and relative rotation of adjacent crystal domains, accidental formation of waveguides, and unintentional formation of polycrystalline or glass-like structures.

BRIEF DESCRIPTION OF THE DRAWINGS

The features and advantages of the disclosure will readily be appreciated by persons skilled in the art from the following detailed description when read in conjunction with the drawings, wherein:

FIG. 4a is a set of schematic top views illustrating an exploded arrangement of particles in four adjacent layers of a face-centered-cubic three-dimensional crystal lattice.

FIG. 4b is a side elevation view of particles illustrating a face-centered-cubic three-dimensional crystal lattice.

FIG. 5 is a top plan view of a representative portion of an embodiment of a (100)-plane template for forming a face-centered-cubic photonic crystal made in accordance with the invention.

DETAILED DESCRIPTION OF EMBODIMENTS

Throughout this description and the appended claims, the prefix "nano-" is used to refer to dimensions expressed in nanometers, i.e., dimensions less than about one micrometer. Nanoimprint lithography methods as used in the embodiments described herein are known to be capable of forming structures having minimum dimensions of less than about 25 nanometers as well as larger structures. See,. e.g., S. Y. Chou et al., "Imprint Lithography with 25-Nanometer Resolution," *Science,* Vol. 272, pp. 85–87 (Apr. 5, 1996) and U.S. Pat. No. 5,772,905 to S. Y. Chou, entitled "Nanoimprint Technology," issued on Jun. 30, 1998, both of which are incorporated herein by reference in their entirety.

Throughout this description and the appended claims, the terms "photonic" and "optical" refer to interactions and to structures or devices interacting with electromagnetic radiation of any frequency or wavelength, and should not be construed as being limited to wavelengths of light visible to humans. Thus, for example, electromagnetic radiation includes far-infrared radiation and gamma rays, which, despite having wavelengths that differ by orders of magnitude, can interact optically with a photonic crystal.

In accordance with one aspect of an embodiment of the invention, a self-assembled photonic crystal is formed by using a template made by nanoimprint lithography. A layer of imprintable material is deposited on a substrate, a pattern is imprinted in the imprintable material to form a template (the pattern of the template being adapted to substantially constrain colloidal particles to a predetermined lattice), and colloidal particles are introduced onto the template, substantially filling the predetermined lattice.

Figure 1:
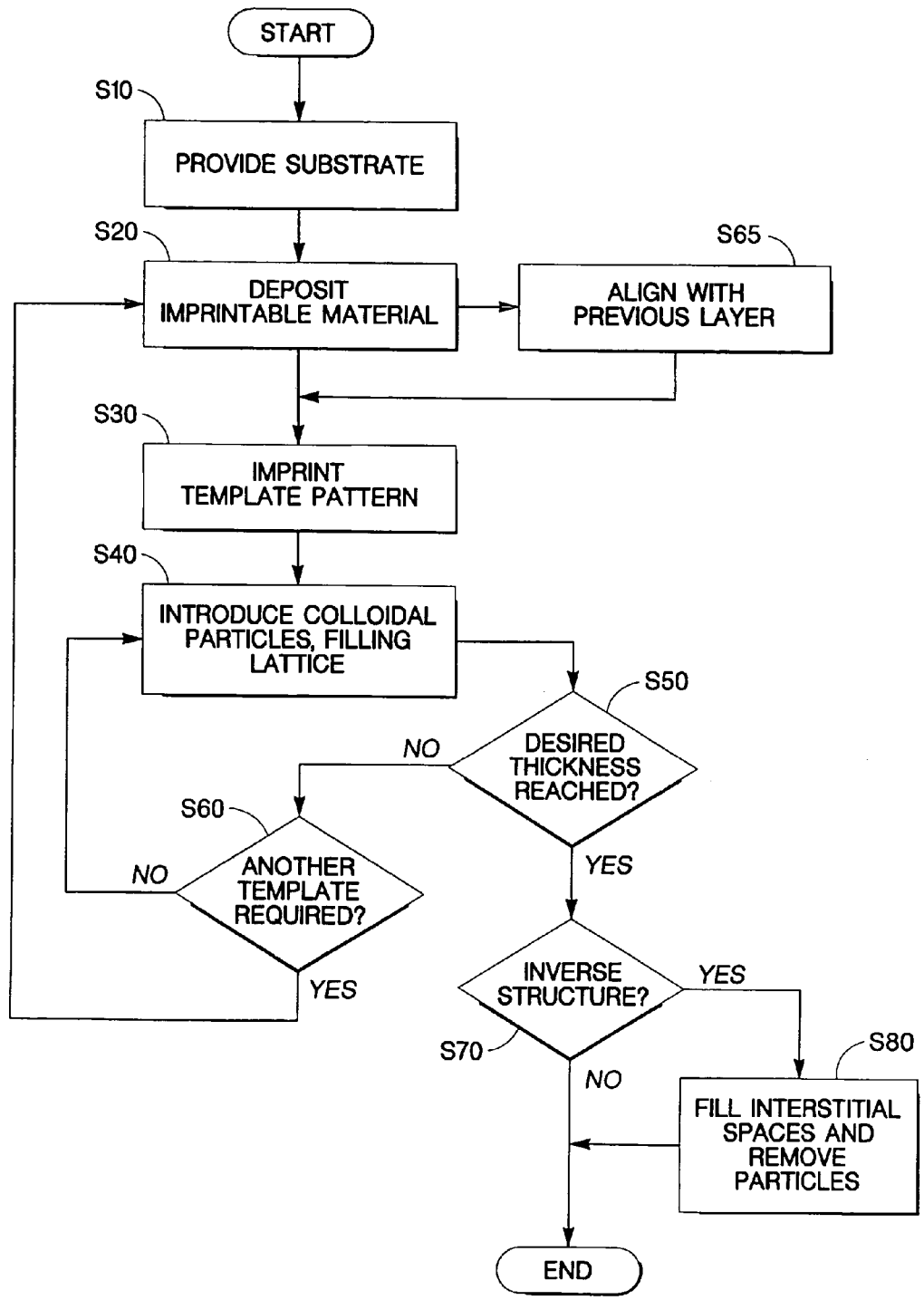
FIG. 1 is a flow chart illustrating an embodiment of a method performed in accordance with the invention.

Thus, one embodiment of a method for fabricating a photonic crystal uses colloidal particles having a particle diameter. The method comprises the steps of providing a substrate, depositing a layer of imprintable material on the substrate, imprinting a template pattern in the imprintable material to form a template, and introducing colloidal particles onto the template, substantially filling the predetermined lattice. The template pattern is adapted to substantially constrain the colloidal particles to a predetermined crystal lattice. Such a method is illustrated in FIG. 1 and described in more detail below.

Figure 2:
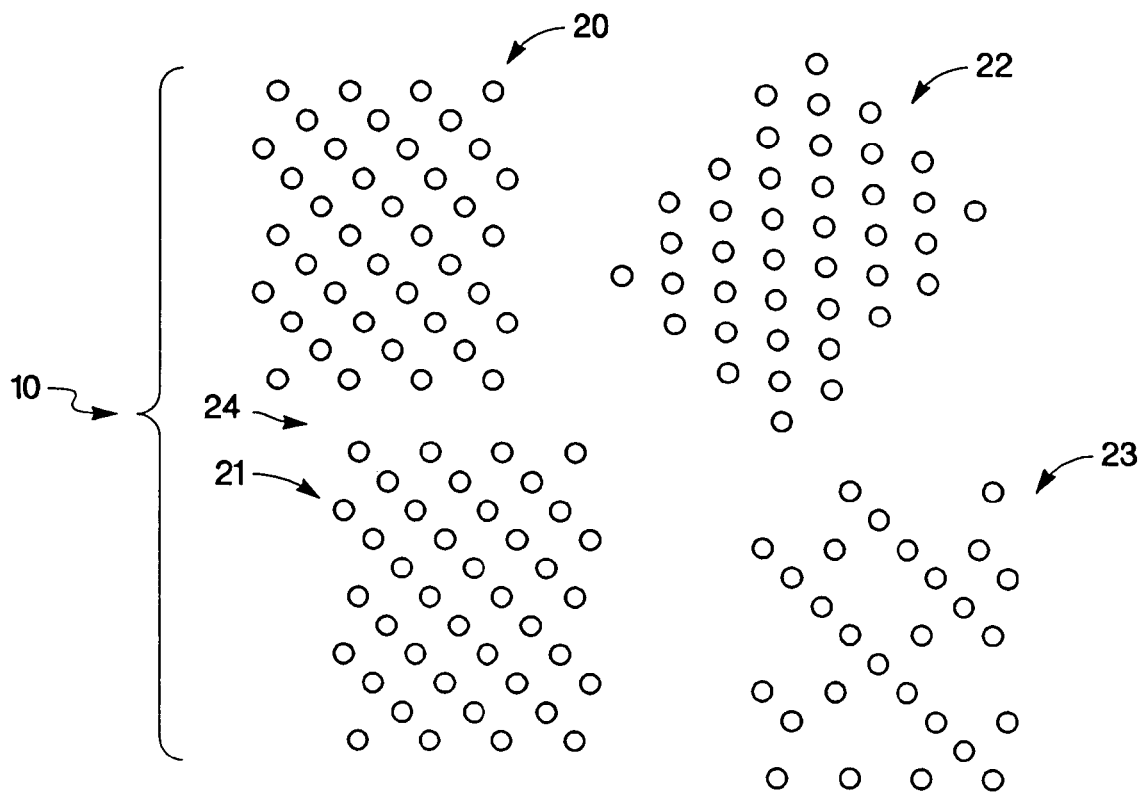
FIG. 2 is a schematic top view of a two-dimensional arrangement of particles illustrating shortcomings in the background art.

FIG. 2 is a schematic top view of a two-dimensional arrangement 10 of particles, illustrating various problems that can occur in conventional self-assembly of colloidal particles. In practice, such problems can occur in three dimensional structures, but the two dimensional example shown in FIG. 2 clearly illustrates the problems. For example, the particles can form crystallites or domains 20 and 21 that are misaligned with each other, resulting in the misalignment boundary 24. The particles can form crystallites or domains 20 and 22 that are rotated relative to each other. Crystal structures such as that of crystallite 23 can form, differing in symmetry and/or lattice constants from the other domains 20, 21, and 22. Thus, the undesirable arrangement of particles in FIG. 2 represents a polycrystalline or mixed-phase crystal structure. Similarly, an undesirable glass-like structure with only short-range order (not shown) can be formed under some conditions. Such defects in crystal structures can prevent a desired photonic bandgap from occurring for one or more directions of electromagnetic wave propagation through the crystal.

As described in more detail below, the predetermined lattice of the template used in embodiments of the present invention is a crystallographic lattice plane of a desired crystal structure, such as a face-centered-cubic crystal structure. The predetermined lattice may be adapted to prevent formation of a polycrystalline structure, e.g., by providing only one crystallographic lattice plane pattern covering the entire area of a photonic crystal to be formed. The same single-crystal lattice plane pattern covering the entire area of a photonic crystal to be formed adapts the lattice to prevent formation of a mixed-phase crystal structure or a glass-like structure. The predetermined lattice of the template also allows control over placement and orientation of the particles.

One type of undesirable mixed-phase three-dimensional crystal structure that can occur in conventional self-assembly of colloidal particles may be understood by reference to FIGS. 3a, 3b, 4a, and 4b. This problem can occur when the initial layer of the crystal structure is a hexagonal-close-packed layer, for example.

Figure 3A:
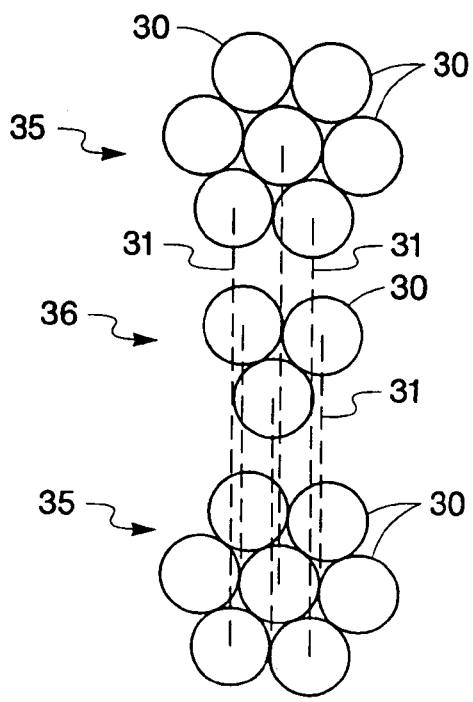
FIG. 3a is a set of schematic top views illustrating an exploded arrangement of particles in three adjacent layers of a hexagonal-close-packed three-dimensional crystal lattice.
Figure 3B:
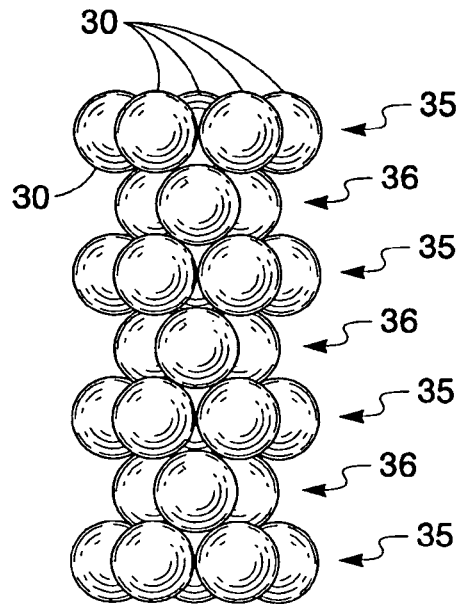
FIG. 3b is a side elevation view of particles illustrating a hexagonal-close-packed three-dimensional crystal lattice.

FIG. 3a is a set of schematic top views illustrating an exploded arrangement of particles 30 in three adjacent layers of a hexagonal-close-packed three-dimensional crystal lattice. Two identical hexagonal-close-packed layers 35 are separated by a layer 36. Vertical alignments of the particles are shown by dashed lines 31. As shown, the particles 30 of the two layers 35 are aligned with each other. The particles 30 of layer 36 are aligned with interstices between the particles 30 of layers 35. FIG. 3b is a side elevation view of particles illustrating a hexagonal-close-packed three-dimensional crystal lattice. Layers 35 and 36 alternate in this crystal structure, in accordance with the alignments illustrated in FIG. 3a.

FIG. 4a is a set of schematic top views illustrating an arrangement of particles in four adjacent layers of a face-centered-cubic three-dimensional crystal lattice (exploded vertically). Hexagonal-close-packed layers 35 are separated by two adjacent layers 40 and 41. (Only one reference particle 30 is shown in the top layer 35.) Vertical alignments of the particles 30 are shown by dashed lines 32. As shown, the particles 30 of the two layers 35 are aligned with each other. The particles 30 of layers 40 and 41 are aligned with different interstices between the particles 30 of layers 35. Thus, the particles 30 of layers 40 and 41 are not aligned vertically with each other. FIG. 4b is a side elevation view of particles illustrating a face-centered-cubic three-dimensional crystal lattice. The sequence of layers 35, 40, and 41 repeats vertically in this crystal structure, in accordance with the alignments illustrated in FIG. 4a.

When the initial layer for conventional self-assembly of colloidal particles is a hexagonal-close-packed layer of particles, the two structures shown in FIGS. 3b and 4b can both occur, intermixed. This mixture of hexagonal-close-packed (HCP) and face-centered-cubic (FCC) three-dimensional crystal lattices is an example of the undesirable mixed-phase three-dimensional crystal structure mentioned above. To prevent such mixtures, template embodiments made in accordance with the present invention may be designed to avoid using a hexagonal-close-packed layer as the initial layer for self-assembly of colloidal particles.

However, the lattice of a template embodiment used in the invention may be a crystallographic lattice plane of a face-centered-cubic crystal structure. The predetermined lattice may be a lattice plane of the face-centered-cubic crystal structure formed by suitably stacking hexagonal-close-packed planes of the colloidal particles. It will be clear to those skilled in the art that "suitably stacking" includes avoiding the mixing of hexagonal-close-packed (HCP) and face-centered-cubic (FCC) three-dimensional crystal lattices as described above.

In particular, the predetermined lattice of a template embodiment may be a (100) or (110) crystallographic lattice plane of a face-centered-cubic crystal structure. In another embodiment, the predetermined lattice of the template may be a lattice plane of a diamond crystal structure or any other desired crystal structure.

FIG. 5 shows a top plan view of a representative portion of an embodiment of a (100) plane template 45 for forming a face-centered-cubic photonic crystal made in accordance with the invention, with colloidal particles 30 already introduced onto template 45. Particles 30 rest in depressions arranged in the (100) plane of the face-centered-cubic photonic crystal with equal periodicity or lattice constants 50 in both of the orthogonal directions in the (100) plane. The depressions in this embodiment of a template 45 may be circular depressions of the same diameter as particles 30 as shown in FIG. 5. In other embodiments, these depressions may have diameters larger or smaller than the diameters of particles 30, e.g., larger or smaller diameter by about 50% than that of particles 30 [other shapes than circular can be used as well including square, triangle, rectangle, etc.].

The flow chart in FIG. 1 illustrates an embodiment of a method performed for fabricating a photonic crystal in accordance with the invention. Steps of the method are denoted by reference numerals S10, S20, . . . , S80. First, a suitable substrate is provided (step S10). The substrate may be a silicon wafer, for example, which may be coated with a layer of a suitable dielectric. A layer of imprintable material is deposited (S20) on the substrate. The imprintable material may be a polymer, such as an ultraviolet(UV)-curable polymer, a thermoplastic polymer, a thermosetting polymer, a polyester, a polycarbonate, a photoresist, or polymethylmethacrylate (PMMA). It may be deposited by spinning the imprintable material onto the substrate, for example.

A template pattern is imprinted (S30) in the imprintable material to form a template. The template pattern is designed to substantially constrain the colloidal particles to the predetermined lattice crystallographic lattice plane described above. In some embodiments, the template pattern may have a minimum feature size smaller than the particle diameter of the colloidal particles, however. For example, the template pattern may include an array of small suitably spaced dimples into which spherical colloidal particles may drop. In other embodiments, the template pattern may have a minimum feature size smaller than about twice the particle diameter of the colloidal particles. Generally, the minimum feature size of the template pattern and of the template formed with it, will be characterized by a nano-scale dimension, i.e., less than about one micrometer.

Step S30 of imprinting a template pattern in the imprintable material may be performed by using a mold having a substantially regular array of raised bosses, suitably disposed for forming the predetermined crystallographic lattice plane. Molds suitable for nanoimprint lithography of the template pattern have nano-scale raised bosses, i.e., bosses characterized by boss heights and boss widths or lateral dimensions in at least one direction of less than about one micrometer. While this description is directed to a template for a single predetermined crystallographic lattice, those skilled in the art will recognize that the pattern of the imprinting mold may be made to include a predetermined super-lattice periodicity as well.

In step S40, colloidal particles are introduced onto the template, substantially filling the predetermined lattice. Introducing the colloidal particles may be accomplished by depositing a thin layer of a colloidal suspension of particles and evaporating the matrix solvent, for example. In another embodiment of the method, step S40 of introducing colloidal particles onto the template may be performed by inserting the template into a solution containing the colloidal particles in suspension.

The colloidal particles are characterized by their particle size, and the particle size of the colloidal particles may be chosen to provide a desired photonic band-gap of the photonic crystal product prepared by the methods of the present invention.

In a relatively simple embodiment of the method, the crystallographic layer of colloidal particles self-assembled on the template pattern as described above serves as the template for the next layer of particles of a three-dimensional photonic crystal. In this embodiment, successive layers of colloidal particles are introduced, one over the other, until a desired thickness of the photonic crystal is reached. That is, if the desired photonic crystal thickness has not been reached (decision step S50), then step S40 of introducing further colloidal particles is repeated a number of times, each repetition providing the substrate and template for the next repetition, until a desired thickness of photonic crystal is formed. The method may include affixing each crystallographic layer of colloidal particles to the previous crystallographic layer of colloidal particles (e.g., by fusing the particles at an elevated temperature or using complimentary ligands on the colloidal particles for alternating layers).

In other embodiments, a new template may be required (as decided in decision step S60) to form a particular crystallographic layer to be built upon a previous crystallographic layer of colloidal particles. The previous layer of colloidal particles serves as the substrate (not as the template) for the next layer. In such cases, the new template is made in substantially the same manner as the first template, by repeating steps S20 and S30. The new template, however, is aligned (step 65) with the previous crystallographic layer, e.g., by aligning the mold with the previous crystallographic layer's template or with the substrate. The template for the first crystallographic layer may also be aligned with the substrate. For this purpose, registration or alignment marks may be made in the substrate and/or in the imprinted pattern of each template. Such alignment marks may be used in optical or electrical alignment methods such as the Moire alignment techniques described in U.S. Pat. No. 5,772,905 to S. Y. Chou, incorporated by reference hereinabove, or may be used in other methods known to those skilled in the art of nanoimprint lithography. The alignment marks may be placed in locations that do not interfere with the periodicity of the template pattern, e.g., outside the edges of the crystallographic pattern. A mold used to imprint a template pattern aligned to a previous crystal layer may include at least one alignment mark.

For some photonic crystal structures, a number of specific templates may be needed, one for each distinctive layer of the photonic crystal. Generally, the method may include repeating the step of depositing a layer of imprintable material on the substrate, the step of imprinting a template pattern in the imprintable material to form a template, and the step of introducing colloidal particles onto the template, a number of times, each repetition providing the substrate for the next repetition, until a desired thickness of photonic crystal is formed. Generally, after the colloidal particles are introduced, there will be interstitial spaces between the particles, even if the particles are close-packed.

If an inverse structure is to be made (as decided in step S70), the interstitial spaces between the colloidal particles are filled with a second material of a different refractive index and the colloidal particles themselves are removed (step S80) to leave the "inverse" photonic crystal in which the crystal lattice positions are occupied by voids in a matrix of the second material. For example, the second material may be a high dielectric material such as titanium dioxide ($TiO_2$), and the colloidal particles (e.g., mono-disperse polystyrene) may be removed by ashing.

In various other embodiments of the method, the template may be removed, e.g., after affixing the colloidal particles to the substrate or while affixing the particles to the substrate. For example, if the colloidal particles are silica spheres and the template is a polymer, the template may be removed by ashing at high temperatures. The temperature may also be high enough to affix the particles to the substrate. For some applications, it may be desirable to remove the substrate, e.g., after the photonic crystal is assembled.

For some embodiments of the methods, a template patterned by nanoimprinting may be further formed by using deposition and/or etching processes known to those skilled in semiconductor fabrication arts. The template pattern formed in the imprintable material has recessed portions shaped by the mold and has un-recessed portions. A layer of material may be deposited over both the recessed and un-recessed portions of the template pattern, and the material may be selectively lifted off from the un-recessed portions. Materials that may be deposited include thin layers of metals, semiconductors, or dielectrics, for example. The imprintable material may be selectively etched according to the template pattern. For some applications, the substrate may be selectively etched in accordance with the template pattern.

Thus, another aspect of the invention is a method embodiment for fabricating a photonic crystal from colloidal particles by providing a substrate, depositing a layer of imprintable polymer on the substrate, and imprinting a first pattern in the imprintable polymer (the first pattern having recessed and un-recessed portions), depositing a layer of material over both the recessed and un-recessed portions of the first pattern, selectively lifting off the material from the un-recessed portions to form a template (the template's pattern being adapted to substantially constrain the colloidal particles to a predetermined lattice), and introducing colloidal particles onto the template, substantially filling the predetermined lattice. Furthermore, in forming the template, either the imprintable polymer or the material deposited over the imprintable polymer, or both, may be etched. For example, a method that includes etching the template pattern into the substrate and includes removing any residual imprintable polymer may be used to form a template that is usable at higher temperatures than a template formed only in a polymer layer.

Figure 6A:
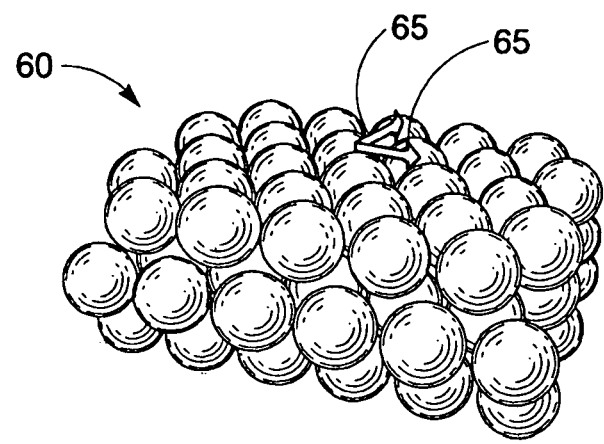
FIG. 6a is a perspective view of particles arranged according to an embodiment of a hexagonal-close-packed (111) template.
Figure 6B:
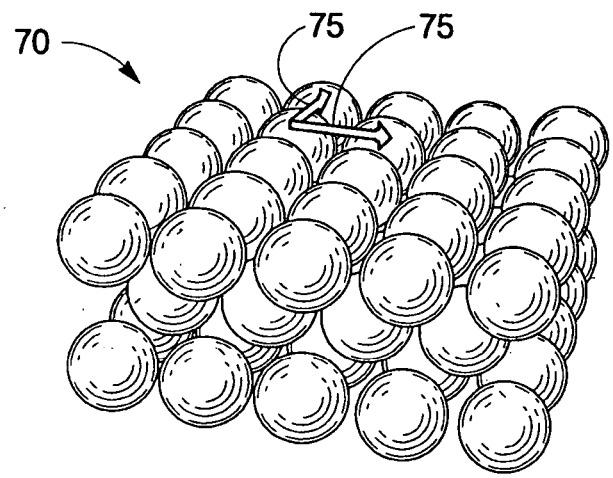
FIG. 6b is a perspective view of particles arranged according to an embodiment of a face-centered-cubic (100) template in accordance with the invention.
Figure 6C:
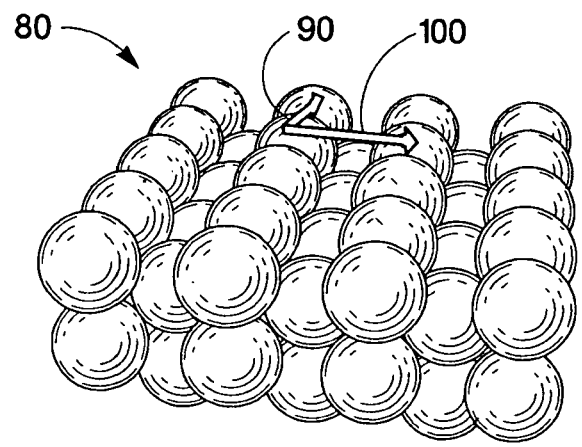
FIG. 6c is a perspective view of particles arranged according to an embodiment of a face-centered-cubic (110) template in accordance with the invention.

FIG. 6a is a perspective view of particles arranged in a three-dimensional structure 60 according to an embodiment of a hexagonal-close-packed (111) template. The lattice constants 65 along the three principal directions in the (111) plane are equal. This is an example of a structure formed by suitably stacking hexagonal-close-packed planes of the colloidal particles, avoiding the mixing of hexagonal-close-packed (HCP) arid face-centered-cubic (FCC) three-dimensional crystal lattices as described above. FIGS. 6b and 6c show three-dimensional structures that avoid this problem.

FIG. 6b is a perspective view of particles arranged in a three-dimensional structure 70 according to an embodiment of a face-centered-cubic (100) template such as that of FIG. 5. The lattice constants 75 along the two orthogonal principal directions in the (100) plane are equal and equivalent to the lattice constant 50 of the template of FIG. 5.

FIG. 6c is a perspective view of particles arranged in a three-dimensional structure 80 according to an embodiment of a face-centered-cubic (110) template. The lattice constants 90 and 100 along the two orthogonal principal directions in the (110) plane are not equal.

While the method has been described so far in terms of a uniform crystal lattice, there are applications that call for intentional local deviations from a perfect lattice. Thus, it is sometimes desirable to make a template pattern wherein at least a portion has a local lattice constant differing from that of a regular lattice plane, such as a plane of the face-centered-cubic crystal structure formed by suitably stacking hexagonal-close-packed planes of particles. To make such a template, at least a predetermined portion of the mold is made with a local lattice constant differing from that of the predetermined lattice.

Figure 7:
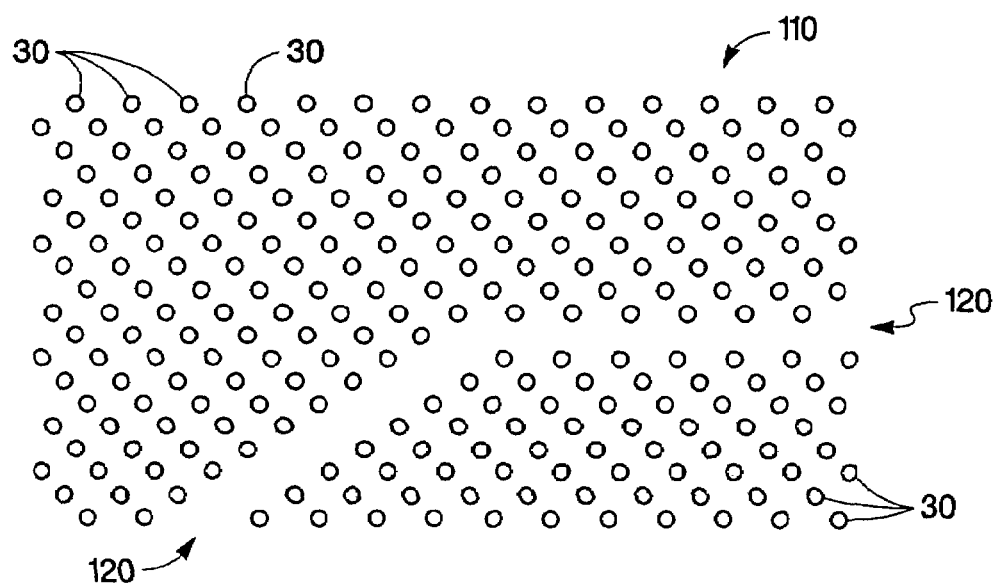
FIG. 7 is a schematic top plan view of an embodiment of a template for forming a photonic crystal having an integral waveguide in accordance with the invention.

As an example, such a mold and template can be used to make a photonic crystal including an integral waveguide. At least a portion of the template pattern is made to include a waveguide pattern. FIG. 7 is a schematic top plan view of an embodiment of a template 110 for forming a photonic crystal having an integral waveguide 120. Template 110 has an array of regularly spaced features for particles 30 of the crystallographic lattice, except that the regular periodicity is interrupted along a portion shaped for forming waveguide 120. To make a template 110 like that of FIG. 7 various types of molds may be used, as illustrated in FIGS. 8a–8c.

Figure 8A:
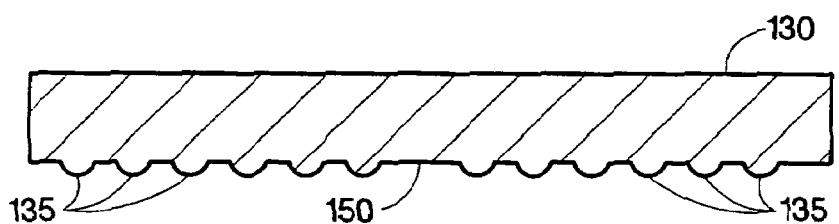
FIGS. 8a, 8b, and 8c are cross sectional elevation views of various embodiments of a nanoimprint mold used in accordance with the invention for forming a photonic crystal having an integral waveguide.
Figure 8B:
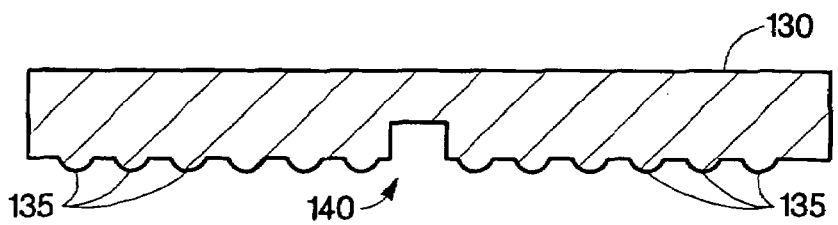
Figure 8C:
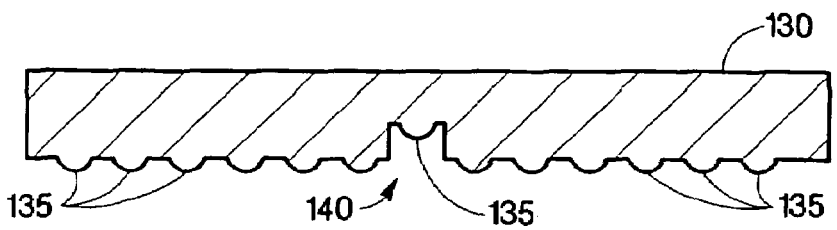

FIGS. 8a, 8b, and 8c are cross sectional elevation views of various embodiments of a nanoimprint mold 130 used in accordance with the invention for forming a photonic crystal having an integral waveguide 120.

FIG. 8a shows a mold 130 having a regular array of raised bosses 135 disposed for forming the predetermined crystallographic lattice plane. But a portion 150 is free of raised bosses 135, thus locally interrupting the crystallographic lattice of the pattern imprinted by the mold. Wherever a portion 150 occurs in the mold, the imprinted pattern lacks depressions for constraining colloidal particles to the crystallographic lattice. Portion 150 is extended in a direction out of the plane of FIG. 8a to locally interrupt the crystallographic lattice and produce a waveguide like waveguide 120 shown in FIG. 7.

FIG. 8b shows a mold 130 having a regular array of raised bosses 135 disposed for forming the predetermined crystallographic lattice plane, but a portion 140 of the mold is recessed, thus locally interrupting the crystallographic lattice of the pattern imprinted by the mold. Recessed portion 140 causes a raised area in the pattern imprinted by the mold, and the raised area prevents colloidal particles from occupying the corresponding lattice position. Mold 130 has a number of recesses 140 replacing selected bosses 135. A series of recessed portions 140 may extend in a direction out of the plane of FIG. 8b to locally interrupt the crystallographic lattice and produce a waveguide like waveguide 120 shown in FIG. 7.

In the embodiment shown in FIG. 8c, each of the recesses 140 of mold 130 has a boss 135 within it for defining a vertically displaced particle position in the template pattern formed by the mold. This has the effect of aligning a colloidal particle vertically with the waveguide formed by the template pattern made by mold 130. The boss 135 within each of the recesses 140 may be made with a boss height that is less than the recesses' depth.

Thus, by using a mold like those of FIG. 8a–8c, the portion of the mold 130 having a local lattice constant differing from that of the predetermined lattice can define a waveguide 120 by forming a template pattern that will guide colloidal particles into a waveguide arrangement.

Those skilled in the art will recognize that molds may be made with various designs for imprinting to form suitable depressions in a template, and the template(s) thus formed may be used for self-assembly of particles into photonic crystals. Each assembled photonic crystal may be incorporated into an integrated circuit utilizing its specific optical properties.

More generally, a photonic device may be made, incorporating the photonic crystal with an input optically coupled to the photonic crystal and with an output optically coupled to the photonic crystal. For example, the input may project an image onto a first surface of the photonic crystal, the photonic crystal may modify the image, and the output may project the modified image outwardly from the first surface or from a second surface of the photonic crystal to a region outside the photonic device. Modification of the image may comprise filtering selected wavelengths from the image, for example. Other functional photonic devices using photonic crystals include selective reflectors, optical couplers, resonant cavities, delay lines, and optical waveguides.

Generally, after the predetermined lattice is filled with colloidal particles, interstitial spaces remain between the colloidal particles. In accordance with another aspect of an embodiment of the invention, an inverse photonic crystal structure may be made by filling the interstitial spaces with a desired second material and removing the colloidal particles. The inverse structure comprising the second material may be an inverse face-centered-cubic structure, for example.

In all the method embodiments that use multiple template patterns, the methods may include registering or aligning each successive template pattern with a previous template pattern. The templates formed may not be identical for all repetitions. For example, those templates that include an integral waveguide are not identical to those templates that do not include a waveguide. The template formed for each repetition is adapted to cooperate with other templates to form a desired three-dimensional crystal structure, such as a face-centered-cubic three-dimensional crystal structure.

Thus, another aspect of the invention includes embodiments of templates for use in assembling a photonic crystal from colloidal particles. The template embodiments perform the functions of providing support and constraining the colloidal particles substantially to a predetermined lattice.

While the term "template" has sometimes been used in the background art to refer to a mold for imprint lithography, it is not used with that meaning in the present specification and claims. Here, the term "template" is reserved for the article made by the imprinting mold, viz., the article used to provide support and to guide or constrain the colloidal particles substantially to a predetermined lattice as the colloidal particles assemble into a photonic crystal. Thus, expressed in terms as used in the present specifications and claims, a mold is used to imprint a pattern for forming a template, and the template in turn controls the self-assembly of particles into a photonic crystal.

Another aspect of the invention includes embodiments of a method of using a template in assembling a photonic crystal from colloidal particles. The method comprises providing a substrate, forming the template on the substrate by depositing and imprinting an imprintable material with a template pattern, and introducing colloidal particles onto the template, substantially filling a predetermined lattice. The template pattern is adapted to substantially constrain the colloidal particles to the predetermined lattice. This method of using a template may include a step of forming one or more registration features on the substrate, on the imprinted template pattern, or on both for alignment, and may include the step of aligning a template pattern to the substrate and/or to a previous template pattern.

Yet another aspect of the invention includes embodiments of a method for fabricating a photonic crystal from colloidal particles characterized by a particle diameter. This method comprises the steps of providing a substrate, depositing a layer of imprintable material on the substrate, imprinting a template pattern in the imprintable material to form a template (the template pattern being adapted to substantially constrain the colloidal particles to a predetermined lattice), introducing colloidal particles onto the template, substantially filling the predetermined lattice, introducing further colloidal particles onto the substantially filled lattice, whereby the substantially filled lattice serves as a template for a successive self-assembled crystallographic layer of colloidal particles, and repeating the previous step a number of times, each repetition providing the substrate and template for the next repetition, until a desired thickness of photonic crystal is formed. Thus, in such method embodiments, only the first lattice layer requires an imprinted template. Successive lattice layers are built up one after another, each lattice layer in effect becoming a template for the next lattice layer. In such method embodiments, the crystallographic orientation of the first lattice layer may be chosen to avoid the necessity of making a number of templates. For some photonic crystal structures, the crystallographic orientation of the first lattice layer may also be chosen to avoid the problem of mixed phases, as described above for the face-centered-cubic example.

Other aspects of the invention include embodiments of another method for fabricating a photonic crystal from colloidal particles characterized by a particle diameter. These method embodiments involve imprinting of multiple template patterns. The methods comprise the steps of providing a substrate, depositing a layer of imprintable material on the substrate, imprinting a template pattern in the imprintable material to form a template (the template pattern again being adapted to substantially constrain the colloidal particles to a predetermined lattice), introducing colloidal particles onto the template, substantially filling the predetermined lattice, and repeating the steps of depositing a layer of imprintable material on the substrate, of imprinting a template pattern in the imprintable material to form a template, and of introducing colloidal particles onto the template a number of times until a desired thickness of photonic crystal is formed (each repetition providing the substrate upon which the next template may be formed for the next repetition). In such embodiments, the number of distinct templates needed depends on the specific crystallographic structure desired for the photonic crystal. These method embodiments may include a step of forming one or more registration features on the substrate, on the imprinted template pattern, or on both for alignment, and may include a step of aligning or registering a lattice layer template pattern to the substrate or a previous lattice layer.

For clarity, it is worth repeating that some of the method embodiments use only one imprinted template for the first crystallographic layer (or the only crystallographic layer if only one is required). If additional crystallographic layers are needed, the array of particles of each layer may provide the template for the next layer. On the other hand, other method embodiments use multiple templates, e.g., a separate template for each layer. In these embodiments, the array of particles of each layer in effect provides a substrate, not the template, for the next crystallographic layer.

In some embodiments of methods performed in accordance with the invention, flow of the colloidal suspension may be controlled to assist the oriented self-assembly. Similarly, electric fields, magnetic fields, and/or electromagnetic fields may be employed to assist the oriented self-assembly.

Those skilled in the art will recognize that generally uniform particle size is desirable, at least for the simplest photonic crystals. While this detailed description of the embodiments has been consistent with an assumption that the colloidal particles were generally spherical, the invention is not limited to use of a particular particle shape. In particular, a spherical particle shape is not required for operability of the invention. Non-spherical particles may be used in a manner similar to the use of spherical particles. It may be desired to use non-spherical particles in order to avoid symmetry-induced degeneracy in the Brillouin zone. Otherwise in certain cases (face-centered-cubic structures, for example), such degeneracy can allow only a pseudo-gap instead of a full photonic bandgap.

Thus, another aspect of the invention includes embodiments of a method for fabricating a photonic crystal from nanoscale cylinders characterized by a cylinder diameter. For example, carbon or silicon nanotubes having a uniform diameter distribution may be used in such method embodiments. Embodiments of such a method comprise the steps of providing a substrate, depositing a layer of imprintable material on the substrate, imprinting a template pattern in the imprintable material to form a template (the template pattern being adapted to substantially constrain the nanoscale cylinders to a predetermined lattice, introducing nanoscale cylinders onto the template, substantially filling the predetermined lattice), and repeating the step of depositing a layer of imprintable material on the substrate, the step of imprinting a template pattern in the imprintable material to form a template, and the step of introducing nanoscale cylinders onto the template, a number of times, each repetition providing the substrate for the next repetition, until a desired thickness of photonic crystal is formed.

Some embodiments of this method may include orienting each successive template pattern at a predetermined angle to the previous template pattern. The nanoscale cylinders may comprise nano-rods or nanotubes.

INDUSTRIAL APPLICABILITY

Methods of the present invention and the photonic crystals made by these methods are useful for manipulating and controlling propagation of electromagnetic waves. The structures may be used in optical integrated circuits and many other applications. The methods are suitable for mass-production fabrication of photonic crystals, while reducing or eliminating unintentional mixtures of different crystal lattices, misalignment and relative rotation of adjacent crystal domains, accidental formation of waveguides, and unintentional formation of polycrystalline or glass-like structures.

Although the foregoing has been a description and illustration of specific embodiments of the invention, various modifications and changes thereto can be made by persons skilled in the art without departing from the scope and spirit of the invention as defined by the following claims. For example, a super-lattice structure may be formed in the direction perpendicular to the substrate instead of (or in addition to) a super-lattice in a plane parallel to the substrate. The order of method steps may be varied to some extent. Particles of various shapes, such as acicular, polygonal, or other shapes, may be used instead of (or in addition to) the shapes described, and various suitable materials may be substituted for the materials described.

What is claimed is:

1. A method for fabricating a photonic crystal from colloidal particles having a particle diameter, the method comprising the steps of:
    a) providing a substrate;
    b) depositing a layer of imprintable material on the substrate;
    c) imprinting a template pattern in the imprintable material to form a template, the template pattern being adapted to substantially constrain the colloidal particles to a predetermined lattice, at least a selected local portion of the template pattern having the predetermined lattice locally interrupted or having a local lattice constant differing from that of a lattice plane of the face-centered-cubic crystal structure formed by suitably stacking hexagonal-close-packed planes of the colloidal particles; and
    d) introducing colloidal particles onto the template, substantially filling the predetermined lattice.

2. The method of claim 1, wherein the predetermined lattice is a crystallographic lattice plane of a desired crystal structure.

3. The method of claim 2, wherein the predetermined lattice is adapted to prevent formation of a polycrystalline structure.

4. The method of claim 2, wherein the predetermined lattice is adapted to prevent formation of a mixed-phase crystal structure.

5. The method of claim 2, wherein the predetermined lattice is adapted to prevent formation of a glass-like structure.

6. The method of claim 1, wherein the predetermined lattice is a crystallographic lattice plane of a face-centered-cubic crystal structure.

7. The method of claim 6, wherein the predetermined lattice is a lattice plane of the face-centered-cubic crystal structure formed by suitably stacking hexagonal-close-packed planes of the colloidal particles.

8. The method of claim 1, wherein the predetermined lattice is a (100) crystallographic lattice plane of a face-centered-cubic crystal structure.

9. The method of claim 1, wherein the predetermined lattice is a (110) crystallographic lattice plane of a face-centered-cubic crystal structure.

10. The method of claim 1, wherein the predetermined lattice is a crystallographic lattice plane of a diamond crystal structure.

11. The method of claim 1, wherein the step b) of depositing a layer of imprintable material on the substrate is performed by spinning the imprintable material onto the substrate.

12. The method of claim 1, wherein the imprintable material is selected from the list consisting of an ultraviolet (UV)-curable polymer, a thermoplastic polymer, a thermosetting polymer, a polyester, a polycarbonate, a photoresist, and polymethylmethacrylate (PMMA).

13. The method of claim 1, wherein the template pattern has a minimum feature size smaller than the particle diameter of the colloidal particles.

14. The method of claim 1, wherein the template pattern has a minimum feature size smaller than about twice the particle diameter of the colloidal particles.

15. The method of claim 1, wherein the template pattern has a nano-scale minimum feature size.

16. The method of claim 1, wherein the colloidal particles are characterized by a particle size, the photonic-crystal has a desired photonic band-gap, and the particle size of the colloidal particles is adapted to provide the desired photonic band-gap.

17. The method of claim 1, wherein at least a portion of the template pattern includes a waveguide pattern.

18. The method of claim 1, wherein step c) of imprinting a template pattern in the imprintable material is performed using a mold having a substantially regular array of raised bosses disposed suitably for forming the predetermined lattice.

19. The method of claim 18, wherein the raised bosses have at least one nano-scale lateral dimension.

20. The method of claim 18, wherein the raised bosses have nano-scale heights.

21. The method of claim 18, wherein the mold further includes at least one alignment mark.

22. The method of claim 18, wherein at least a predetermined portion of the mold has a local lattice constant differing from that of the predetermined lattice.

23. The method of claim 22, wherein a predetermined portion of the mold is free of raised bosses, whereby the predetermined lattice is locally interrupted.

24. The method of claim 22, wherein a predetermined portion of the mold has a number of recesses replacing selected bosses, whereby the predetermined lattice is locally interrupted.

25. The method of claim 24, wherein each of the recesses of the mold has within it at least one boss for defining a vertically displaced particle position in the template pattern formed by the mold.

26. The method of claim 25, wherein the recesses of the mold have a recess depth and the boss within each of the recesses has a height less than the recess depth.

27. The method of claim 22, wherein the predetermined portion of the mold having a local lattice constant differing from that of the predetermined lattice defines a waveguide.

28. The method of claim 1, wherein the predetermined lattice of the template pattern includes a predetermined super-lattice periodicity.

29. The method of claim 1, wherein step d) of introducing colloidal particles onto the template is performed by inserting the template into a solution containing the colloidal particles.

30. The method of claim 1, further comprising the step of:
e) removing the template.

31. The method of claim 1, further comprising the step of:
f) affixing the colloidal particles to the substrate.

32. The method of claim 1, further comprising the step of:
g) removing the substrate.

33. The method of claim 1, wherein interstitial spaces remain between the colloidal particles after filling the predetermined lattice, the method further comprising the steps of:
h) filling the interstitial spaces with a desired second material; and
i) removing the colloidal particles, whereby an inverse structure comprising the second material is formed.

34. The method of claim 33, wherein the inverse structure is an inverse face-centered-cubic structure.

35. The method of claim 1, further comprising the steps of:
j) introducing further colloidal particles onto the substantially filled lattice, whereby the substantially filled lattice serves as a template for a successive self-assembled crystallographic layer of colloidal particles; and
k) repeating step (j) of introducing further colloidal particles a number of times, each repetition providing the substrate and template for the next repetition, until a desired thickness of photonic crystal is formed.

36. A photonic crystal made by the method of claim 35.

37. A photonic crystal made by the method of claim 1.

38. An integrated circuit comprising the photonic crystal of claim 37.

39. A photonic device comprising the photonic crystal of claim 37 and further comprising:
a) an input optically coupled to the photonic crystal, and
b) an output optically coupled to the photonic crystal.

40. The method of claim 35, further comprising the step of:

l) affixing each crystallographic layer of colloidal particles to the previous crystallographic layer of colloidal particles.

41. The method of claim 1, further comprising the step of:
m) repeating the following set of steps a number of times until a desired thickness of photonic crystal is formed:
step b) of depositing a layer of imprintable material,
step c) of imprinting a template pattern in the imprintable material to
form a template, and
step d) of introducing colloidal particles onto the template, each repetition of the set of steps providing the substrate for the next repetition.

42. The method of claim 41, further comprising the step of:
n) aligning each successive template pattern with a previous template pattern.

43. The method of claim 41, wherein the templates formed are not identical for all repetitions.

44. The method of claim 41, wherein the template formed for each repetition is adapted to form a desired three-dimensional crystal structure.

45. The method of claim 41, wherein the template formed for each repetition is adapted to form a face-centered-cubic three-dimensional crystal structure.

46. A photonic crystal made by the method of claim 41.

47. An integrated circuit comprising the photonic crystal of claim 46.

48. A photonic device comprising the photonic crystal of claim 46 and further comprising:
a) an input optically coupled to the photonic crystal, and
b) an output optically coupled to the photonic crystal.

49. The method of claim 1, wherein the steps are performed in the order recited.

50. The method of claim 1, wherein the template pattern formed in the imprintable material has recessed and un-recessed portions, the method further comprising the step of:
o) depositing a layer of material over both the recessed and un-recessed portions of the template pattern in the imprintable material.

51. The method of claim 50, further comprising the step of:
p) selectively lifting off the material from the un-recessed portions of the template pattern.

52. The method of claim 1, further comprising the step of selectively etching the imprintable material in accordance with the template pattern.

53. The method of claim 1, further comprising the step of selectively etching the substrate in accordance with the template pattern before performing step d) of introducing colloidal particles.

54. A method for fabricating a photonic crystal from colloidal particles having a particle diameter, the method comprising the steps of:
a) providing a substrate;
b) depositing a layer of imprintable polymer on the substrate;
c) imprinting a first pattern in the imprintable polymer, whereby the first pattern has recessed and un-recessed portions;
d) depositing a layer of material over both the recessed and un-recessed portions of the first pattern in the imprintable polymer;
e) selectively lifting off the material from the un-recessed portions of the first pattern to form a template having a template pattern, the template pattern being adapted to substantially constrain the colloidal particles to a predetermined lattice; and f) introducing colloidal particles onto the template, substantially filling the predetermined lattice.

55. The method of claim 54, wherein the steps are performed in the order recited.

56. The method of claim 54, further comprising the step of:

g) etching through at least one of the imprintable polymer and the material deposited over the imprintable polymer.

57. A template for use in assembling a photonic crystal from colloidal particles, the template comprising, in combination:

a) means for constraining the colloidal particles substantially to a predetermined lattice, at least a selected local portion of the template having the predetermined lattice locally interrupted or having a local lattice constant differing from that of a lattice plane of the face-centered-cubic crystal structure formed by suitably stacking hexagonal-close-packed planes of the colloidal particles; and b) means for supporting the means for constraining the colloidal particles.

58. The template of claim 57, wherein the means for constraining the colloidal particles comprises imprintable means having a template pattern imprinted therein, the template pattern being adapted to substantially constrain the colloidal particles to the predetermined lattice.

59. A method of using a template in assembling a photonic crystal from colloidal particles, the method comprising the steps of:

a) providing a substrate;

b) forming the template on the substrate by depositing and imprinting an imprintable material with a template pattern, the template pattern being adapted to substantially constrain the colloidal particles to a predetermined lattice, at least a selected local portion of the template pattern having the predetermined lattice locally interrupted or having a local lattice constant differing from that of a lattice plane of the face-centered-cubic crystal structure formed by suitably stacking hexagonal-close-packed planes of the colloidal particles; and c) introducing colloidal particles onto the template, substantially filling the predetermined lattice.

60. The method of claim 59, further comprising the step of:

d) forming at least one alignment feature on at least one of the substrate and the imprinted template pattern for alignment.

61. A method for fabricating a photonic crystal from colloidal particles having a particle diameter, the method comprising the steps of:

a) providing a substrate;

b) depositing a layer of imprintable material on the substrate;

c) imprinting a template pattern in the imprintable material to form a template, the template pattern being adapted to substantially constrain the colloidal particles to a predetermined lattice;

d) introducing colloidal particles onto the template, substantially filling the predetermined lattice;

e) introducing further colloidal particles onto the substantially filled lattice, whereby the substantially filled lattice serves as a template for a successive self-assembled crystallographic layer of colloidal particles; and f) repeating the previous step (e) a number of times until a desired thickness of photonic crystal is formed, each repetition providing the template for the next repetition.

62. A method for fabricating a photonic crystal from colloidal particles having a particle diameter, the method comprising the steps of:

a) providing a substrate;

b) depositing a layer of imprintable material on the substrate;

c) imprinting a template pattern in the imprintable material to form a template, the template pattern being adapted to substantially constrain the colloidal particles to a predetermined lattice;

d) introducing colloidal particles onto the template, substantially filling the predetermined lattice; and e) repeating the following set of steps a number of times until a desired thickness of photonic crystal is formed:
step b) of depositing a layer of imprintable material,
step c) of imprinting a template pattern in the imprintable material to form a template, and
step d) of introducing colloidal particles onto the template, each repetition providing the substrate for the next repetition.

63. A method for fabricating a photonic crystal from nanoscale cylinders having a cylinder diameter, the method comprising the steps of:

a) providing a substrate;

b) depositing a layer of imprintable material on the substrate:

c) imprinting a template pattern in the imprintable material to form a template, the template pattern being adapted to substantially constrain the nanoscale cylinders to a predetermined lattice;

d) introducing nanoscale cylinders onto the template, substantially filling the predetermined lattice; and e) repeating the following set of steps a number of times until a desired thickness of photonic crystal is formed:
step b) of depositing a layer of imprintable material,
step c) of imprinting a template pattern in the imprintable material to form a template, and
step d) of introducing nanoscale cylinders onto the template, each repetition providing the substrate for the next repetition.

64. The method of claim 63, wherein each successive template pattern is oriented at a predetermined angle to the previous template pattern.

65. The method of claim 63, wherein the nanoscale cylinders comprise nano-rods.

66. The method of claim 63, wherein the nanoscale cylinders comprise nanotubes.

67. A nanoimprint lithography mold for forming a template for a photonic crystal having an integral waveguide, the mold comprising:

a) a first portion having a first substantially regular array of raised bosses disposed suitably for forming a predetermined crystallographic lattice;

b) a second portion disposed to define a waveguide location, the second portion being free of raised bosses, whereby the predetermined crystallographic lattice is locally interrupted along the waveguide location.

68. A nanoimprint lithography mold for forming a template for a photonic crystal having an integral waveguide, the mold comprising:

a) a first portion having a first substantially regular array of raised bosses disposed suitably for forming a predetermined crystallographic lattice;
b) a second portion having a second substantially regular array of raised bosses disposed suitably for forming the predetermined crystallographic lattice; and
c) a third portion disposed to define a waveguide location between the first and second portions, the third portion being free of raised bosses, whereby the predetermined crystallographic lattice is locally interrupted along the waveguide location.

69. A nanoimprint lithography mold for forming a template for a photonic crystal having an integral waveguide, the mold comprising:
a) a first portion having a first substantially regular array of raised bosses disposed suitably for forming a predetermined crystallographic lattice; and b) a second portion having a local lattice constant differing from that of the predetermined lattice, the second portion being disposed to define a waveguide.

* * * * *